United States Patent
Schaaf (10) Patent No.: US 10,534,044 B2
(45) Date of Patent: Jan. 14, 2020

(54) TEMPERATURE COMPENSATION METHOD OF MAGNETIC CONTROL FIELDS IN A HALL SENSOR WITH OS ADAPTION

(71) Applicant: TE Connectivity Germany GmbH, Bensheim (DE)

(72) Inventor: Oliver Schaaf, Lustadt (DE)

(73) Assignee: TE Connectivity Germany GmbH, Bensheim (DE)

( * ) Notice: Subject to any disclaimer, the term of this patent is extended or adjusted under 35 U.S.C. 154(b) by 236 days.

(21) Appl. No.: 15/142,603

(22) Filed: Apr. 29, 2016

(65) Prior Publication Data

US 2016/0238672 A1    Aug. 18, 2016

Related U.S. Application Data (63) Continuation of application No. PCT/EP2014/073199, filed on Oct. 29, 2014.

(30) Foreign Application Priority Data

Oct. 30, 2013    (DE) .................. 10 2013 222 097

(51) Int. Cl.
*G01D 5/14*    (2006.01)
*G01R 33/00*    (2006.01)
(Continued)

(52) U.S. Cl.
CPC ......... *G01R 33/0082* (2013.01); *G01D 5/145* (2013.01); *G01D 5/2448* (2013.01);
(Continued)

(58) Field of Classification Search
CPC .......... G01D 5/145; G01D 5/142; G01D 5/14; G01D 5/2448
See application file for complete search history.

(56) References Cited

U.S. PATENT DOCUMENTS 4,833,406 A * 5/1989 Foster .................... G01D 3/032
                                                324/225
5,589,769 A * 12/1996 Krahn .................... G01D 5/145
                                                324/207.21
(Continued)

FOREIGN PATENT DOCUMENTS

CN    1576798 A    2/2005
CN    1643341 A    7/2005
(Continued)

OTHER PUBLICATIONS

PCT Notification, International Search Report and Written Opinion, Application No. PCT/EP2014/073199, dated Feb. 5, 2015, 14 pages.
(Continued)

*Primary Examiner* — Mischita L Henson
*Assistant Examiner* — Christine Y Liao
(74) *Attorney, Agent, or Firm* — Barley Snyder (57) ABSTRACT

A method for detecting a relative position of a magnetic field source is disclosed. The method comprises the steps of detecting at least two magnetic field components of a magnetic field produced by a magnetic field source using a magnetic field sensor, determining a temperature effect compensation which compensates for a temperature effect on the magnetic field components, and establishing an output signal corresponding to the relative position of the magnetic field source based on a quotient of the magnetic field components, the temperature effect compensation, and an offset correction.

17 Claims, 4 Drawing Sheets

(51) Int. Cl.
*G01R 33/07* (2006.01)
*G01D 5/244* (2006.01)
*G01D 3/036* (2006.01)

(52) U.S. Cl.
CPC ......... *G01D 5/24485* (2013.01); *G01R 33/07* (2013.01); *G01D 3/036* (2013.01); *G01R 33/0029* (2013.01)

(56) References Cited

U.S. PATENT DOCUMENTS

| | | |
|---|---|---|
| 6,969,988 B2 | 11/2005 | Kakuta et al. |
| 2002/0167306 A1* | 11/2002 | Zalunardo ............ G01D 5/145 324/207.2 |
| 2005/0007105 A1 | 1/2005 | Siegle et al. |
| 2005/0140450 A1* | 6/2005 | Pitz ................... H03F 3/45973 330/279 |
| 2007/0268015 A1 | 11/2007 | Hatanaka et al. |
| 2008/0224692 A1* | 9/2008 | Baak .................. G01D 5/145 324/207.2 |
| 2011/0227567 A1* | 9/2011 | Reidmueller .......... G01D 5/145 324/244 |

FOREIGN PATENT DOCUMENTS

| | | |
|---|---|---|
| DE | 10 2008 045 177 A1 | 3/2010 |
| WO | 2013045430 A1 | 4/2013 |
| WO | 2013156916 A1 | 10/2013 |

OTHER PUBLICATIONS

Chinese Second Office Action with English translation, Chinese Patent Application No. 201480059479.4, dated Nov. 5, 2018, 19 pages.
Chinese First Office Action with English translation, Chinese Patent Application No. 2014800594794, dated Jan. 3, 2018, 19 pages.
Machine translation from Espacenet of DE 10 2008 045 177, dated Mar. 4, 2010, 6 pages.
German Office Action, dated Jul. 3, 2014, German Patent Application No. 10 2013 222 097.9, 7 pages.

\* cited by examiner

TEMPERATURE COMPENSATION METHOD OF MAGNETIC CONTROL FIELDS IN A HALL SENSOR WITH OS ADAPTION

CROSS-REFERENCE TO RELATED APPLICATIONS

This application is a continuation of PCT International Patent Application No. PCT/EP2014/073199, filed Oct. 29, 2014, and German Patent Application No. 102013222097.9, filed Oct. 30, 2013.

FIELD OF THE INVENTION

The present invention relates to a measurement method for detecting a relative position of a magnetic field source in relation to a magnetic field sensor, and more particularly, to a method for compensating for the effect of thermally caused variations of magnetic control fields on the output signal of a magnetic sensor.

BACKGROUND

As is known in the prior art, magnetic field sensors such as Hall sensors may be used to detect changes in a magnetic field, for example, to detect a relative position of a magnetic field source. The Hall sensor may detect at least two magnetic flux density components to determine a magnetic flux density vector; with reference to exemplary values of flux density components Bz and By, the value |B| of the magnetic flux density B and the angle α between the radial component By and the vector of the flux density B can be calculated according to the following equations:

$$|B| = \sqrt{Bz^2 + By^2} \quad (1)$$

$$\alpha = \arctan\left(\frac{Bz}{By}\right) \quad (2)$$

European Patent Application EP 2159546 A2 discloses a measurement method for detecting linear relative movements between a Hall sensor which detects two mutually perpendicular magnetic field components (R, A) and a permanent magnet. The output signals of the Hall sensor form a quasi-linear position measurement curve U=f(y) according to the relationship y=a+b·R/f·(c·R″+d·A″) where R is the radial field component, A is the axial field component, U is the measurement voltage and a, b, c, d and n are constant factors. In this method, the factor b may be dynamically adapted as a scaling factor for the temperature coefficient of the permanent magnet, detected for example by means of a temperature sensor.

Although EP 2159546 A2 discloses compensating for the temperature coefficient of the permanent magnet, both the measurement method of EP 2159546 A2 and conventional 2D and 3D Hall sensors and measurement methods react to variations in the spacing between the control magnet and the Hall sensor in a very sensitive manner. Variations in spacing, for example, because of mechanical vibrations or even thermally caused material expansion, can significantly influence the accuracy of the measurements of the Hall sensor.

In order to overcome or at least minimize the effect of the spacing between the permanent magnetic field and the Hall sensor, a measurement method was developed with Offset-Slope adaption (OS adaption) and a corresponding displacement sensor, as described in the published German Patent Application DE 10 2011 115 302 A1. In comparison with conventional Hall sensors having internal arctangent calculation as shown in Equation 2 above, a 2D or 3D Hall sensor with OS adaption uses a different calculation method in which the direct quotient of the detected magnetic field components Bz to By are not used for the calculation of the measurement signal or the angle α. Instead, the magnetic field component Bz which extends in a movement direction of the magnet is corrected by means of a constant offset value.

That offset value OS results in a slope assimilation of the curves for the angle α for different spacings d between a permanent magnet and Hall sensor. The corrected values of the angle α are established according to the following equation:

$$\alpha_{OS} = \arctan\left(\frac{Bz + OS}{By}\right) \quad (3)$$

In order to obtain an adequate effect for the OS adaption, the offset value OS is generally defined at from 20% to 60% of the value of the magnetic field component Bz. The OS values can be established by one of the methods described in DE 10 2011 115 302 A1.

The use of the evaluation method with OS adaption can result in a negative influence on the temperature behaviour of the arctangent calculation by means of the magnetic field of a control magnet. Although the values of the detected magnetic field components Bz and By for the temperature T of the magnetic field are influenced by the same thermal variations of the control magnet, temperature compensation is not provided in Equation 3 using the OS adaption. Depending on the relationship of the individual terms in Equation 3, there is produced a temperature-dependent additional error of up to 12%, which is unacceptable for the measurement accuracy of the 3D Hall sensor.

In order to be able to completely utilise the evaluation behaviour with OS adaption, therefore, a compensation of the temperature effect of the magnetic control field on the measurement signals of the magnetic sensor is absolutely necessary.

SUMMARY

An object of the invention, among others, is to provide a measurement method and a displacement sensor producing a temperature-independent measurement signal within a broad temperature range. The disclosed measurement method comprises the steps of detecting at least two magnetic field components of a magnetic field produced by a magnetic field source using a magnetic field sensor, determining a temperature effect compensation which compensates for a temperature effect on the magnetic field components, and establishing an output signal corresponding to the relative position of the magnetic field source based on a quotient of the magnetic field components, the temperature effect compensation, and an offset correction.

BRIEF DESCRIPTION OF THE DRAWINGS

The invention will now be described by way of example with reference to the accompanying figures, of which.

DETAILED DESCRIPTION OF EMBODIMENT(S)

The invention is explained in greater detail below with reference to embodiments of a measurement method and displacement sensor. This invention may, however, be embodied in many different forms and should not be construed as limited to the embodiments set forth herein; rather, these embodiments are provided so that this disclosure will be thorough and complete and still fully convey the scope of the invention to those skilled in the art. The magnetic flux density is referred to below only as the magnetic field for simplicity.

Figure 1:
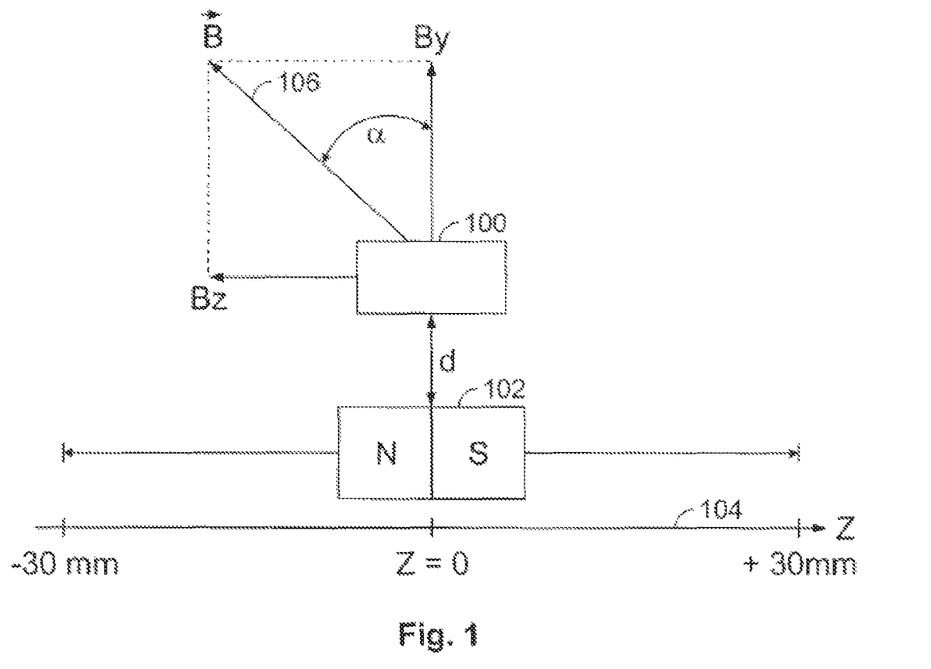
FIG. 1 is a schematic view of a displacement sensor according to the present invention.

A displacement sensor arrangement according to the invention is shown generally in FIG. 1. The displacement sensor arrangement includes a magnetic field sensor 100 and a permanent magnet 102. The major components of the invention will now be described in greater detail.

A magnetic field sensor 100, for example, a 3D Hall sensor, is mounted so as to be fixed in position whereas a permanent magnet 102 is arranged so as to be linearly movable in relation to the Hall sensor 100. The permanent magnet 102 has such poles that its north/south axis is orientated parallel with a movement direction 104 of the permanent magnet 102. In principle, however, it is also possible to apply the present invention to arrangements in which the permanent magnet 102 has such poles that its north/south axis extends transversely relative to the movement direction. The permanent magnet 102 can be displaced from the zero position shown in FIG. 1 in two directions along movement direction 104 by, for example, approximately 30 mm.

The component Bz which extends in the movement direction 104 and the components By and Bx, which are perpendicular thereto, (the component Bx is not illustrated in FIG. 1) of the flux density B are detected by the 3D Hall sensor 100. If the 3D Hall sensor 100 is oriented in a suitable manner with respect to the permanent magnet 102, only two spatial directions have to be detected since the magnetic field does not make any field contribution for the third spatial direction and is consequently zero. The evaluation is then simplified to the flux density components By and Bz, as illustrated in FIG. 1.

Figure 2:
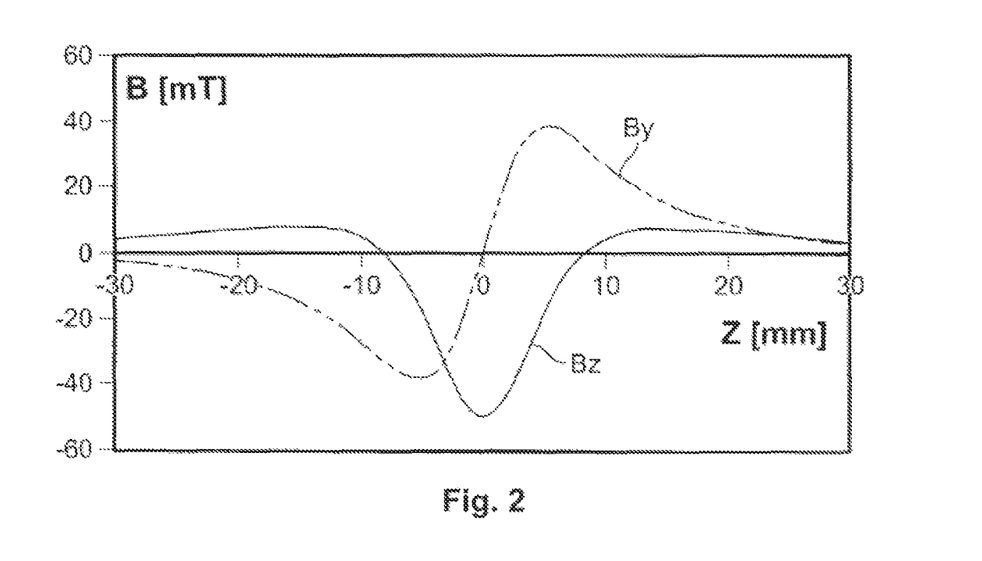
FIG. 2 is a graph depicting the relationship between magnetic field components By and Bz detected by the displacement sensor and the position of a permanent magnet of FIG. 1.

FIG. 2 shows a curve progression of the detected flux densities By and Bz in accordance with the position of the permanent magnet 102 in the movement direction 104, which is indicated in FIG. 1 as the Z axis. The position z=0 in FIGS. 1 and 2 corresponds to the position of the permanent magnet 102 at which the spacing between the Hall sensor 100 and the permanent magnet 102 reaches the smallest spacing value d during the relative movement thereof. The spacing d is achieved when the permanent magnet 102 is precisely positioned in front of the Hall sensor 100.

Figure 3:
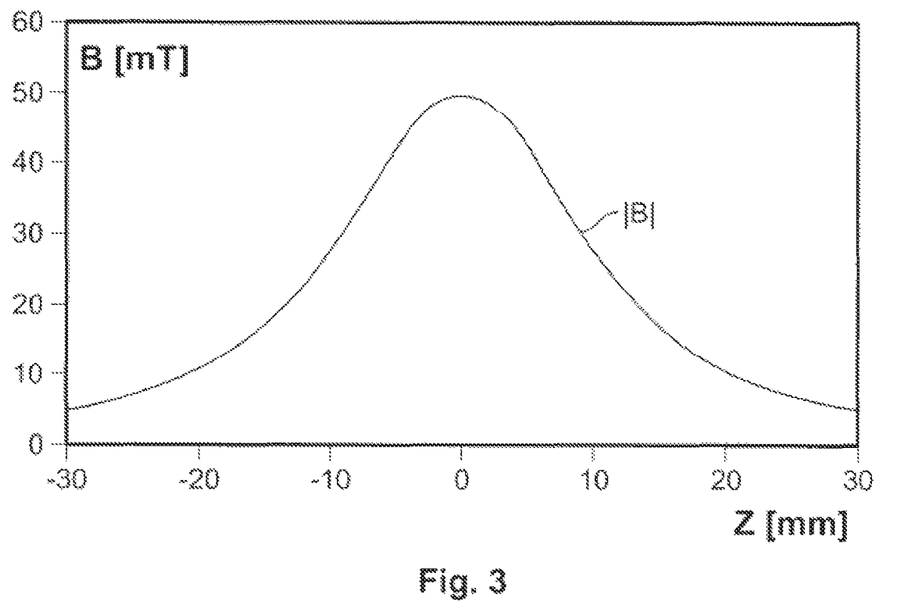
FIG. 3 is a graph depicting the relationship between a value |B| of the magnetic field and the position of the permanent magnet in the displacement sensor of FIG. 1.
Figure 4:
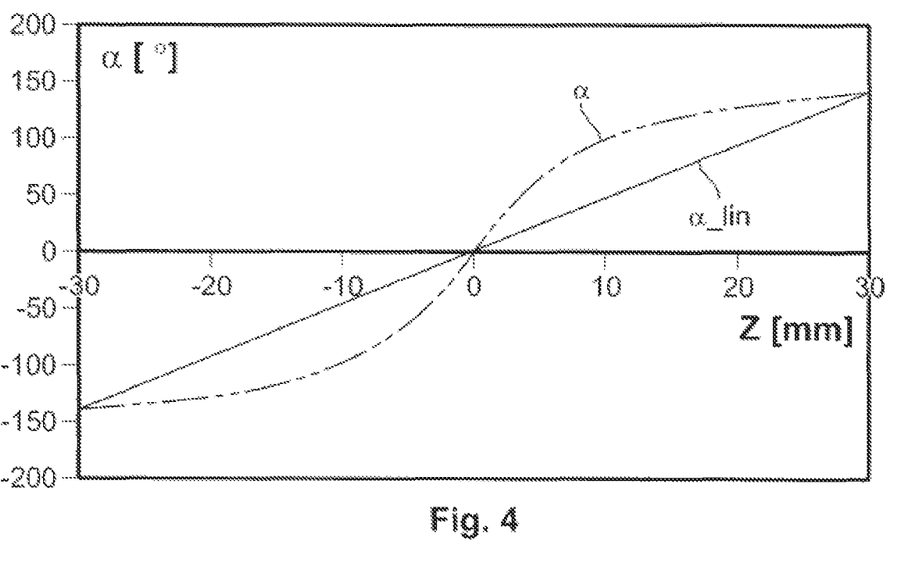
FIG. 4 is a graph depicting the relationship between an angle α, linearised angle α_lin, and the position of the permanent magnet in the displacement sensor of FIG. 1.

The angle α shown in FIG. 1 is defined as the angle between the total magnetic field vector B and the component By perpendicular to the movement direction 104. As described above, the angle α may be calculated in accordance with Equation 2. The results of the calculation of the value |B| and the angle α as a result of the Equations 1 and 2 above, incorporating the values illustrated in FIG. 1, are shown in FIGS. 3 and 4.

Figure 5:
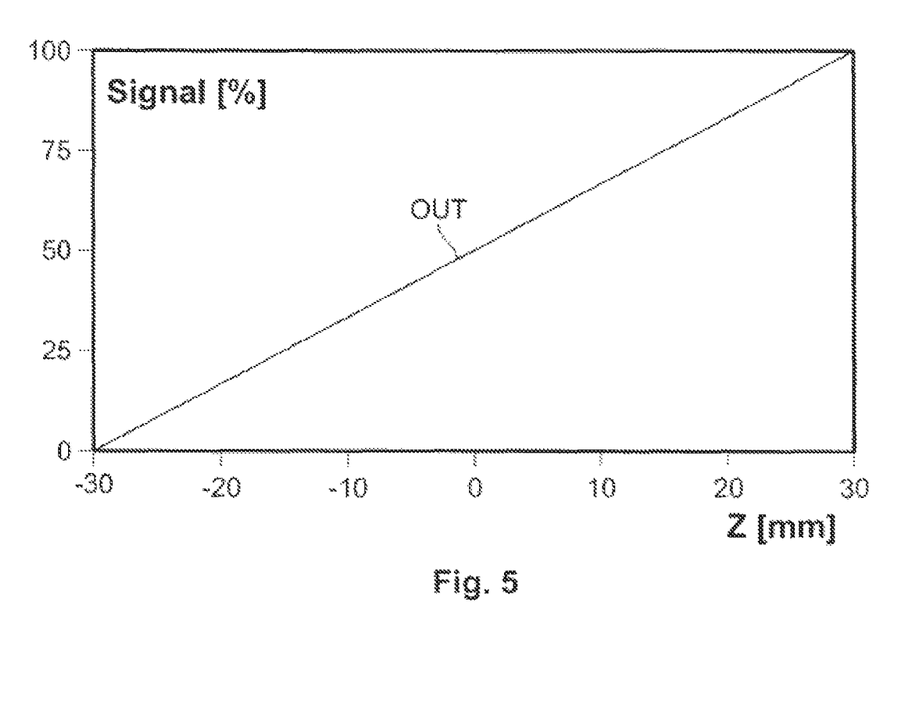
FIG. 5 is a graph depicting a characteristic line for the displacement sensor of FIG. 1 when Offset-Slope adaption is used.

The angle α is generally used as a measuring signal. In particular, the result of the angle α calculated from Equation 2 may be linearised as α_lin shown in FIG. 4 in order to be available as a displacement-proportional output signal OUT, which is shown in FIG. 5 as a percentage signal in accordance with the position z.

The magnetic control field of a magnet can vary over the temperature range, for example, in the automotive industry of from −40° C. to 150° C. by up to 30%. Temperature-dependent magnetic field variations of a control magnet may be incorporated into Equations 1 and 2 in the measured flux density values By and Bz. In particular, Equation 4 below determines angle α having temperature independence because the flux density variations are shortened in the ratio calculation Bz(T) to By(T):

$$\alpha = \arctan\left(\frac{Bz(T)}{By(T)}\right) = \arctan\left(\frac{km(T) \times Bz}{km(T) \times By}\right) \quad (4)$$

where km(T) is a temperature factor of the magnetic field, and Bz and By correspond to the flux densities established in the 3D Hall sensor in the Z direction and Y direction for a predetermined reference temperature, for example, 20° C. In Equation 4, therefore, thermally caused magnetic field variations of the control magnet do not have any influence on the result for the angle values α.

Temperature-dependent magnetic field variations of a control magnet may also be incorporated in the measured flux density values By and Bz of Equation 3 above. According to the invention, the temperature effect of the permanent magnet 102 on the values of the produced components Bz and By is compensated for before the output signal is established.

Temperature-compensated values of the magnetic field components Bz(T) and By(T) which are measured by the magnetic field sensor 100 for a given temperature T of the permanent magnet 102 are established on the basis of temperature-dependent temperature compensation factor kc(T). The following Equation 5 is produced for the calculation of the angle $\alpha_{OS\_TK}$ with temperature compensation:

$$\alpha_{OS\_TK} = \arctan\left(\frac{kc(T) \times Bz(T) + OS}{kc(T) \times By(T)}\right) \quad (5)$$

where the measured magnetic field components Bz(T) and By(T) are multiplied by the temperature compensation factor kc(T). The OS adaption is then applied to the temperature-compensated values of the magnetic field components kc(T)×Bz(T). As set out in Equation 5, the compensated magnetic field component kc(T)×Bz(T) can be corrected by the addition of a constant offset value OS.

The offset value OS can be established by one of the methods with OS adaption which are described in the patent application DE 10 2011 115 302 A1. For example, the offset value can be established for a predetermined reference temperature of the magnetic field source 102 by means of the following steps: establishing a curve of the magnetic field component for a large number of positions of the magnetic field source 102 in the movement direction; calculating a second derivative of the curve in relation to the position of the magnetic field source 102; establishing a zero position of the second derivative; and subtracting the functional value of the curve at the zero location from the functional value at the position of the smallest spacing between the magnetic field source 102 and the magnetic field sensor 100 in order to calculate the value of the offset correction.

The temperature compensation factor kc(T) is adapted in order to compensate for the thermally caused variations of the magnetic field, as described below. The temperature behaviour of magnetic fields of commercially available magnets is strictly dependent on the materials and can therefore be described relatively easily. Usually, the temperature behaviour of the magnet is described by a temperature coefficient $TK_{magnet}$ of the material. The temperature coefficient $TK_{magnet}$ describes the relative change of the value of the magnetic flux density in accordance with the change of the temperature with respect to a fixed reference temperature. A temperature coefficient $TK_{magnet}$ of $-0.1\%/°$ C. therefore corresponds to a reduction of the magnetic flux density B by 10% if the temperature increases by 100° C. (or Kelvin).

The temperature-dependent magnetic field factor km(T) of Equation 4 can be expressed by the following linear function of the temperature coefficient $TK_{magnet}$ and the temperature T of the permanent magnet 102:

$$km(T) = \left(\frac{TK_{magnet}}{100\%}\right) \times (T - 20° \text{ C.}) + 1 \quad (6)$$

where a reference temperature of 20° C. is used.

Magnets comprising NdFeB materials have, for example, a temperature coefficient of typically $TK_{magnet}=-0.11\%/°$ C. The Equation 6 results, for example, in the following temperature-dependent values of the magnetic field factor for a control magnet comprising such materials:

| Temperature T: | Magnetic field factor km (T): |
|---|---|
| −40° C. | km (−40° C.) = 1.066 |
| +20° C. | km (20° C.) = 1.0 |
| +120° C. | km (120° C.) = 0.89 |

Figure 6:
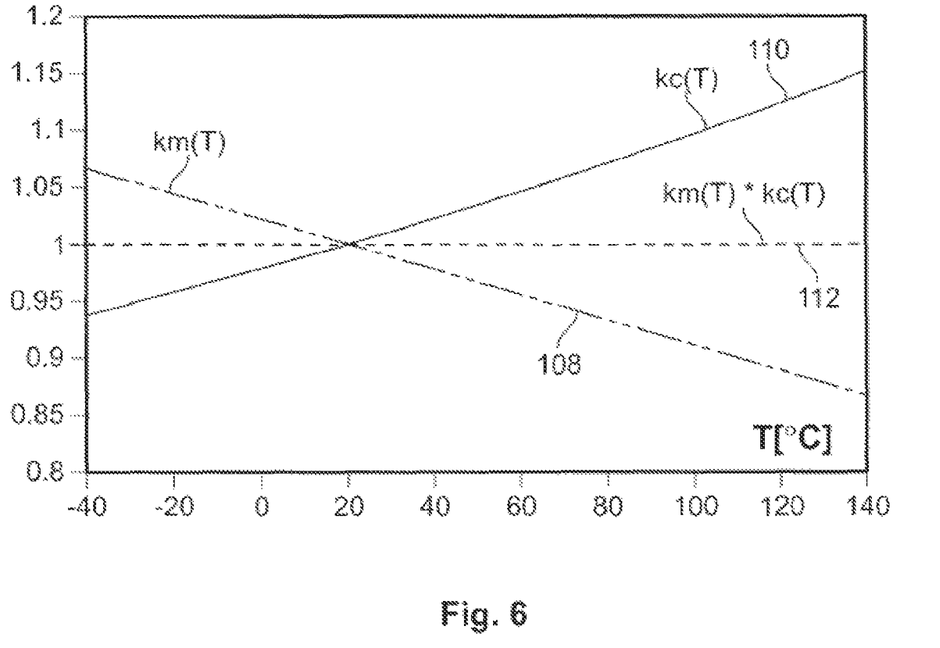
FIG. 6 is a graph depicting the relationship between a characteristic line for magnetic field factor km(T), a characteristic line for temperature compensation factor kc(T), and temperature in the displacement sensor of FIG. 1.

The Equation 6 results in a standardised magnetic field loss B(T)/B(20° C.)=km(T) of the magnetic field over the temperature, as shown in FIG. 6 for a temperature range of from −40 to +140° C.

If the temperature information of the magnet is known to the 3D Hall sensor 100 or is made accessible to it from another location (for example, internal temperature measurement in the 3D Hall sensor 100) and the magnetic properties of the control magnet are also known in the form of the temperature coefficient $TK_{magnet}$, then the temperature-dependent magnetic field variation can be compensated for by the extended calculation of Equation 5. This is achieved by a temperature-dependent calculated decrease or increase of the temperature factor km(T) of the magnetic control field on the basis of the additional compensation factor kc(T). Ideally, the following compensation result is achieved:

$$km(T) \times kc(T) = 1 \quad (7)$$

Equation 7 produces the following relationship for the compensation factor kc(T):

$$kc(T) = \frac{1}{km(T)} = \frac{1}{(TK_{magnet}/100\%) \times (T - 20° \text{ C.}) + 1} \quad (8)$$

FIG. 6 shows the progression of the characteristic line 108 for the magnetic field factor km(T) and the characteristic line 110 for the temperature compensation factor kc(T) in accordance with the temperature of the permanent magnet 102. The compensation requirement of Equation 7 is designated 112 in FIG. 6.

In order to be able to periodically calculate the compensation factor kc(T) in the 3D Hall sensor 100, the temperature coefficient $TK_{magnet}$ of the control magnet 102 used has to be communicated to the 3D Hall sensor 100 or accordingly has to be stored in the sensor 100 for calculation. The temperature information of the magnet 102 can be established, for example, externally directly or in the close environment of the control magnet 102 and be made available to the 3D Hall sensor 100 via a communication connection. Alternatively, the internal temperature information in the 3D Hall sensor 100 can be used and optionally adapted with respect to the temperature of the magnet 102 to be anticipated.

FIG. 6 is only one variant of the calculation. However, there are other calculation methods for the temperature-dependent compensation for the magnetic control field.

The effect of the temperature compensation according to Equation 5 can be indicated as follows. If the values of the measured magnetic field components Bz(T) and By(T) are expressed by means of the magnetic field factor as Bz(T)=km(T)×Bz or as By(T)=km(T)×By, a shortening of the temperature factors km(T) is produced, as set out in the following equation:

$$\alpha_{OS\_TK} = \arctan\left(\frac{kc(T) \times km(T) \times Bz + OS}{kc(T) \times km(T) \times By}\right) \quad (9)$$

Bz and By are magnetic field component values for the predetermined reference temperature and are therefore temperature-independent. The reference temperature corresponds to 20° C. for a temperature compensation factor kc(T) according to Equation 8.

The relationship km(T)×kc(T)=1 produces the following for the calculation of the angle with OS adaption and temperature compensation $\alpha_{OS\_TK}$:

$$\alpha_{OS\_TK} = \arctan\left(\frac{1 \times Bz + OS}{1 \times By}\right) \quad (10)$$

The temperature compensation factor kc(T) then leads to a shortening of the temperature effect of the control magnet 102 to the values of the detected magnetic field components in a measurement method based on an arctangent calculation with OS adaption.

A temperature-independent output signal OUT can then be established from the result of the angle $\alpha_{OS\_TK}$ according to Equation 9 which is further influenced only by a small amount by a possible spacing variation between the magnetic field source 102 and the magnetic field sensor 100. Equation 10 corresponds in terms of form to the original equation for the angle calculation of a 3D Hall sensor with OS adaption, the temperature-dependent magnetic field variations now being compensated for.

Further specification of the temperature compensation can be achieved through a more complex type of the temperature compensation factor kc(T) by the complete temperature behaviour of the magnet 102 being described in the form of a line equation or in the form of correction tables and, for example, being stored in the 3D Hall sensor for calculation. For example, the value of the temperature compensation factor kc(T) for a given temperature T of the magnetic field source 102 can be established on the basis of a temperature compensation table or file, the compensation table or file containing a large number of temperatures of the magnetic field source 102 and a large number of corresponding values of the magnetic field factor km(T) or the temperature compensation factor kc(T).

In another embodiment, the compensation for the temperature effect on the detected magnetic field components in a Hall sensor with OS adaption can be carried out by an alternative calculation, the temperature effect being compensated for by a temperature-dependent offset correction instead of by establishing temperature-compensated values from the measured magnetic field components Bz(T) and By(T). The compensated offset value OS(T) can be established on the basis of the temperature-dependent temperature compensation factor kc(T), the constant offset value of the OS adaption being multiplied by a factor 1/kc(T). The angle $\alpha_{OD\_TK}$ with temperature compensation and OS adaption is then established from the following equation:

$$\alpha_{OS\_TK} = \arctan\left(\frac{Bz(T) + OS/kc(T)}{By(T)}\right) \quad (11)$$

In this embodiment, there is also used a calculation method which corrects the temperature-dependent magnetic control field according to Equation 7. As in the first embodiment, the angle calculation with OS adaption and temperature compensation results in:

$$\alpha_{OS\_TK} = \arctan\left(\frac{1 \times Bz + OS}{1 \times By}\right) \quad (12)$$

The calculation according to the invention can be carried out in the sensor in a two-dimensional or three-dimensional Hall sensor which is already provided with an integrated microprocessor. A linear displacement measurement signal which is independent of the temperature of the control magnet can then be output directly by the sensor. Alternatively, the evaluation by an external analogue or digital calculation unit or a processor which functions in a digital or analogue manner can follow.

Naturally, it is also possible to transfer the principles according to the invention to other magnetic field sources, for example, electromagnets, and to other magnetic field sensors, such as magnetoresistive sensors or inductive sensors. Furthermore, two or three individual sensors can be used in place of a two-dimensional or three-dimensional Hall sensor for detecting different field components.

Advantageously, in both embodiments, the terms of the quotient are compensated for before the arctangent calculation by means of a temperature compensation factor kc(T). Since the calculation according to the invention is a comparatively simple calculation operation, the temperature compensation method of magnetic control fields can be carried out in a 2D or 3D Hall sensor with OS adaption in an extremely simple manner and the precision of a displacement sensor of the generic type can be improved.

What is claimed is:

1. A method for detecting a relative position of a magnetic field source, comprising:
   detecting at least two magnetic field components of a magnetic field produced by a magnetic field source using a magnetic field sensor, the at least two magnetic field components including a first magnetic field component in a direction of a relative movement between the magnetic field source and the magnetic field sensor and a second magnetic field component perpendicular to the first magnetic field component;
   determining a temperature effect compensation which compensates for a temperature effect on the magnetic field components; and
   establishing an output signal corresponding to the relative position of the magnetic field source based on a quotient of the magnetic field components, the temperature effect compensation, and an offset correction, a dividend of the quotient including a first magnetic field component value for the first magnetic field component based on a temperature-dependent temperature compensation factor kc(T) and the offset correction applied to the first magnetic field component value, and a divisor of the quotient including a second magnetic field component value for the second magnetic field component based on the temperature-dependent temperature compensation factor kc(T).

2. The method of claim 1, wherein the first and second magnetic field component values are determined by multiplying the first and second magnetic field component by the temperature compensation factor kc(T).

3. The method of claim 1, wherein the establishing step comprises correcting the first magnetic field component value by a compensated offset correction based on the temperature-dependent temperature compensation factor kc(T) and a predetermined constant offset correction.

4. The method of claim 1, wherein the temperature compensation factor kc(T) is produced from the relationship kc(T)×km(T)=1, where km(T) is a magnetic field factor which corresponds to thermally caused variations of the magnetic field.

5. The method of claim 4, wherein the magnetic field factor km(T) is calculated for a given temperature T of the magnetic field source by the relationship:

$$km(T) = \left(\frac{TK_{magnet}}{100\%}\right) \times (T - T_{ref}) + 1$$

where
$T_{ref}$ is a fixed reference temperature and
$TK_{magnet}$ corresponds to a constant temperature coefficient of the material of the magnetic field source which corresponds to a percentage magnetic field variation per degree.

6. The method of claim 5, wherein the value of the temperature compensation factor kc(T) is established for a given temperature T of the magnetic field source based on a temperature compensation table having a large number of temperatures of the magnetic field source and a large number of corresponding values of the magnetic field factor km(T) or the temperature compensation factor kc(T).

7. The method of claim 1, further comprising detecting a temperature of the magnetic field source.

8. The method of claim 1, further comprising establishing an anticipated temperature of the magnetic field source by using internal temperature information of the magnetic field sensor.

9. The method of claim 1, wherein the magnetic field sensor is a two-dimensional or three-dimensional Hall sensor.

10. The method of claim 9, wherein the magnetic field source is a permanent magnet.

11. The method of claim 1, wherein the value of the offset correction is established for a given temperature of the magnetic field source by:
    establishing a curve of the magnetic field component for a large number of positions of the magnetic field source;
    calculating a second derivative of the curve in relation to the position of the magnetic field source;
    establishing a zero position of the second derivative; and
    subtracting the functional value of the line at the zero location from the functional value at the position of the smallest spacing between the magnetic field source and the magnetic field sensor.

12. A displacement sensor, comprising:
    a magnetic field source producing a magnetic field;
    a magnetic field sensor detecting at least two magnetic field components, the at least two magnetic field components including a first magnetic field component in a direction of a relative movement between the magnetic field source and the magnetic field sensor and a second magnetic field component perpendicular to the first magnetic field component;
    a temperature compensation unit determining a temperature effect compensation which compensates for a temperature effect on the magnetic field components; and
    an output signal unit establishing an output signal corresponding to a relative position of the magnetic field source, the output signal based on a quotient of the magnetic field components, the temperature effect compensation, and an offset correction, a dividend of the quotient including a first magnetic field component value for the first magnetic field component based on a temperature-dependent temperature compensation factor kc(T) and the offset correction applied to the first magnetic field component value, and a divisor of the quotient including a second magnetic field component value for the second magnetic field component based on the temperature-dependent temperature compensation factor kc(T).

13. The displacement sensor of claim 12, wherein the temperature compensation unit multiplies the detected magnetic field component by the temperature compensation factor kc(T).

14. The displacement sensor of claim 13, wherein the temperature compensation factor kc(T) is produced from the relationship kc(T)×km(T)=1, wherein km(T) is a magnetic field factor which corresponds to thermally caused variations of the magnetic field.

15. The displacement sensor of claim 12, wherein the magnetic field sensor is a two-dimensional or three-dimensional Hall sensor.

16. The displacement sensor of claim 15, wherein the magnetic field source is a permanent magnet.

17. The displacement sensor of claim 12, wherein the magnetic field source produces a magnetic field which is rotationally symmetrical with respect to an axis extending in the direction of the relative movement between the magnetic field source and the magnetic field sensor, and the magnetic field sensor is arranged in order to detect the first magnetic field component along the rotationally symmetrical axis.

* * * * *